(12) United States Patent
Levinski et al.

(10) Patent No.: US 10,579,768 B2
(45) Date of Patent: Mar. 3, 2020

(54) PROCESS COMPATIBILITY IMPROVEMENT BY FILL FACTOR MODULATION

(71) Applicant: KLA-Tencor Corporation, Milpitas, CA (US)

(72) Inventors: Vladimir Levinski, Migdal HaEmek (IL); Eitan Hajaj, Ashqelon (IL); Tal Itzkovich, Kfar Uriya (IL); Sharon Aharon, Hanaton (IL); Michael E. Adel, Zichron Ya'akov (IL); Yuri Paskover, Caesarea (IL); Daria Negri, Haifa (IL); Yuval Lubashevsky, Haifa (IL); Amnon Manassen, Haifa (IL); Myungjun Lee, San Jose, CA (US); Mark D. Smith, San Jose, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 15/502,950

(22) PCT Filed: Nov. 4, 2016

(86) PCT No.: PCT/US2016/060626
§ 371 (c)(1),
(2) Date: Feb. 9, 2017

(87) PCT Pub. No.: WO2017/176314
PCT Pub. Date: Oct. 12, 2017

(65) Prior Publication Data
US 2018/0157784 A1 Jun. 7, 2018

Related U.S. Application Data

(60) Provisional application No. 62/318,086, filed on Apr. 4, 2016.

(51) Int. Cl.
*G06F 17/50* (2006.01)
*H01L 21/027* (2006.01)
*G03F 7/20* (2006.01)

(52) U.S. Cl.
CPC .......... *G06F 17/5081* (2013.01); *G03F 7/705* (2013.01); *G03F 7/70625* (2013.01); *G03F 7/70683* (2013.01); *H01L 21/027* (2013.01)

(58) Field of Classification Search
CPC .......... G06F 17/5081; G03F 1/70; G03F 1/76; G03F 7/70; G03F 7/0002; G03F 1/36;
(Continued)

(56) References Cited

U.S. PATENT DOCUMENTS

| 6,303,252 B1 | 10/2001 | Lin |
| 7,925,486 B2 | 4/2011 | Smith et al. |

(Continued)

FOREIGN PATENT DOCUMENTS

CN 102520594 A 6/2012

OTHER PUBLICATIONS

ISA/KR, International Search Report for PCT/US2016/060626 dated Mar. 13, 2017.
(Continued)

*Primary Examiner* — Paul Dinh
(74) *Attorney, Agent, or Firm* — Hodgson Russ LLP (57) ABSTRACT

Metrology targets and target design methods are provided, in which target elements are defined by replacing elements from a periodic pattern having a pitch p, by assist elements having at least one geometric difference from the replaced elements, to form a composite periodic structure that maintains the pitch p as a single pitch. Constructing targets within the bounds of compatibility with advanced multiple patterning techniques improves the fidelity of the targets and fill factor modulation enables adjustment of the targets to pro-
(Continued)

duce sufficient metrology sensitivity for extracting the overlay while achieving process compatibility of the targets.

5 Claims, 9 Drawing Sheets

(58) Field of Classification Search
CPC .. G03F 7/70441; G03F 7/705; G03F 7/70625; G01B 11/14; G01N 21/47
USPC .................................................. 430/5; 716/53
See application file for complete search history.

(56) References Cited

U.S. PATENT DOCUMENTS

| | | | |
|---|---|---|---|
| 2002/0015899 A1* | 2/2002 | Chen | G03F 1/26 430/5 |
| 2002/0045106 A1 | 4/2002 | Baselmans et al. | |
| 2002/0131055 A1* | 9/2002 | Niu | G03F 7/70441 356/603 |
| 2005/0196682 A1* | 9/2005 | Hsu | G03F 1/36 430/5 |
| 2007/0082277 A1* | 4/2007 | Matthew | G03F 1/36 430/5 |
| 2008/0311344 A1 | 12/2008 | Marie Kiers et al. | |
| 2009/0053622 A1 | 2/2009 | Lee | |
| 2010/0103433 A1* | 4/2010 | Ausschnitt | B81C 99/0065 356/630 |
| 2016/0061589 A1* | 3/2016 | Bhattacharyya | G01B 11/14 356/620 |
| 2017/0059999 A1* | 3/2017 | Van Der Schaar | G01N 21/47 |
| 2018/0364591 A1* | 12/2018 | Socha | G01N 21/956 |

OTHER PUBLICATIONS

Subramaniam et al., "Leakage reduction through optimization of regular layout parameters," Microelectronics Journal, vol. 43,I17 Oct. 2011, pp. 25-33.
EPO, Supplementary European Search Report for EP16898139, dated Oct. 28, 2019.

* cited by examiner

PROCESS COMPATIBILITY IMPROVEMENT BY FILL FACTOR MODULATION

CROSS REFERENCE TO RELATED APPLICATIONS

This application claims the benefit of U.S. Provisional Patent Application No. 62/318,086 filed on Apr. 4, 2016, which is incorporated herein by reference in its entirety.

BACKGROUND OF THE INVENTION

1. Technical Field

The present invention relates to the field of metrology, and more particularly, to overlay metrology target design.

2. Discussion of Related Art

Figure 1A:
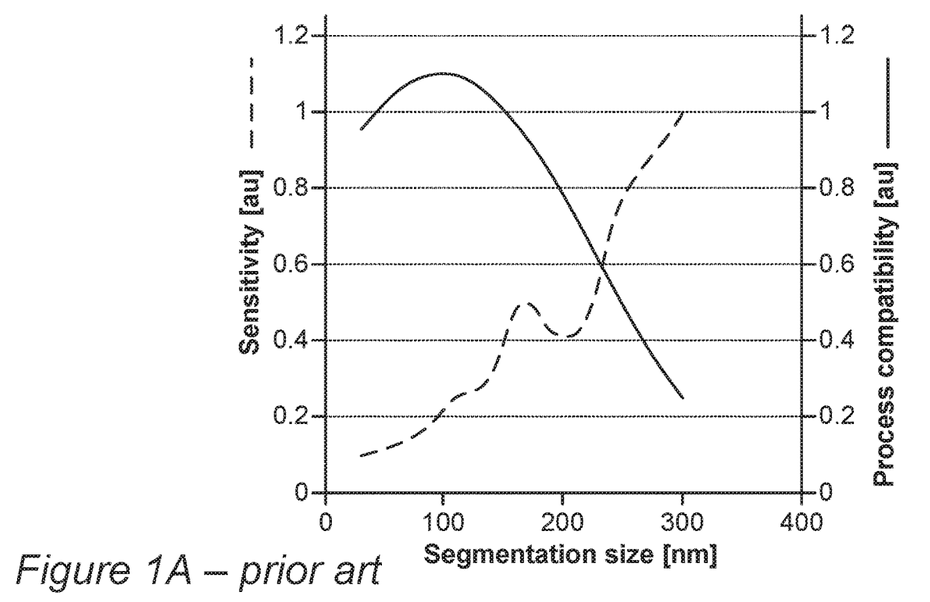
FIG. 1A schematically presents the tradeoff between the sensitivity and the process compatibility of the target design in relation to the segmentation size of the target structures, according to the prior art.

Overlay metrology structures face the need to meet the conflicting requirements of metrology sensitivity on the one hand, and manufacturability or process compatibility on the other hand. Correspondingly, as an illustration, FIG. 1A schematically presents the tradeoff between the sensitivity and the process compatibility of the target design in relation to the segmentation size of the target structures, according to the prior art.

As a general rule the minimum pitch of the integration scheme is significantly smaller than the so-called coarse pitch of the metrology structure which is optimized for the metrology sensor. The lower bound of the coarse pitch is typically set by the requirement that for a given illumination wavelength, a minimum of two diffraction orders are required to be collected by the sensor collection optics. Furthermore, in many cases the minimum illumination wavelength is bound by the opacity at short wavelengths of intermediate layers between the current and previous layer gratings of the metrology target. For example, the minimum printable lithographic pitch may be 100 nm while the coarse pitch of the overlay target may be in the order of 2000 nm.

The conventional method to achieve process compatibility is to reduce the size of the segmentation (the fine pitch of the metrology target) to the domain of the minimum design rule feature of the specific layer. There is an innate tradeoff in this approach since as the segmentation size approaches that of the minimum design rule for which the manufacturing process has been optimized, the sensitivity decreases to a level in which the sensor is unable to extract the overlay within reasonable bounds of uncertainty. Various prior art target designs have been suggested to optimize targets in view of this innate tradeoff, such as parallel, orthogonal or even diagonal segmentation of target structures, as exemplified in FIGS. 1B, 1C and 1D, respectively.

In recent semiconductor manufacturing nodes, self-aligned double and quadruple patterning have emerged as viable and critical alternatives to extreme UV (ultraviolet) or other advanced patterning schemes to enable ever denser and smaller features. In these methods, the ability to print ever tighter pitches in enabled by complex integration schemes having extremely tight restrictions on what can and cannot be printed.

Figure 1B:
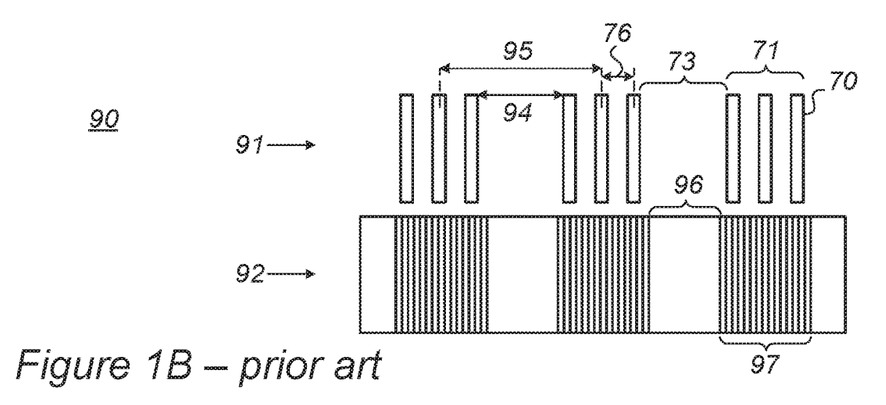
FIGS. 1B, 1C and 1D schematically illustrate parallel, orthogonal and diagonal segmentation schemes of target structures, respectively, according to the prior art.
Figure 1C:
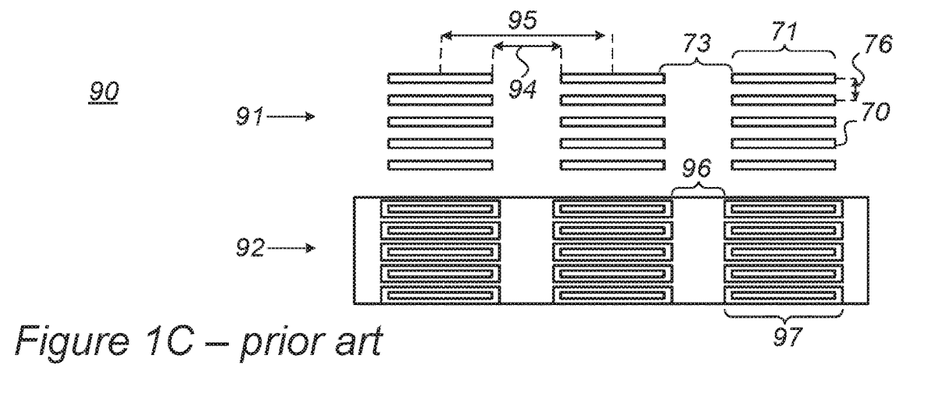
Figure 1D:
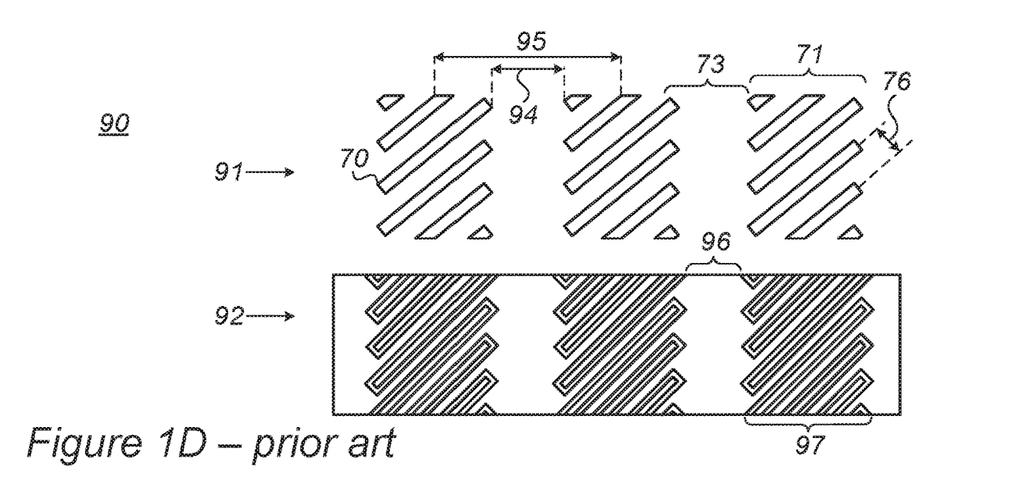

FIGS. 1B, 1C and 1D schematically illustrate parallel, orthogonal and diagonal segmentation schemes 90 of target structures, respectively, according to the prior art. FIGS. 1B, 1C and 1D illustrate segmentation schemes 90 (spacer assist quadruple patterning parallel segmentation) as GDS Mask schemes 91 and as on-wafer schemes 92. Target elements comprise segmentation elements 70 having a fine segmentation pitch 76 and a coarse segmentation pitch 95, with spaces 94 between adjacent segmented structures composed of the target elements. The target structures comprise these segmented structures 71 with gaps 73 between them which are printed as corresponding structures 97 and gaps 96. However, these prior art methods typically result in design rule violations in multiple patterning schemes, e.g., due to the SADP (self-aligned double patterning) or SAQP (self-aligned quadruple patterning) integration schemes.

Because of the optical limitation of the measurement tools (using visible light) a minimal space 96 between bars 97 has to be maintained, to comply with the optical resolution and induce contrast between line and space. Large space 96 may impact the process compatibility of the target, hence reducing the target performances and the device to target similarity. In order to overcome this issue, CMP (chemical mechanical processing) assist features were introduced, trading off the process compatibility with the contrast.

Figure 1E:
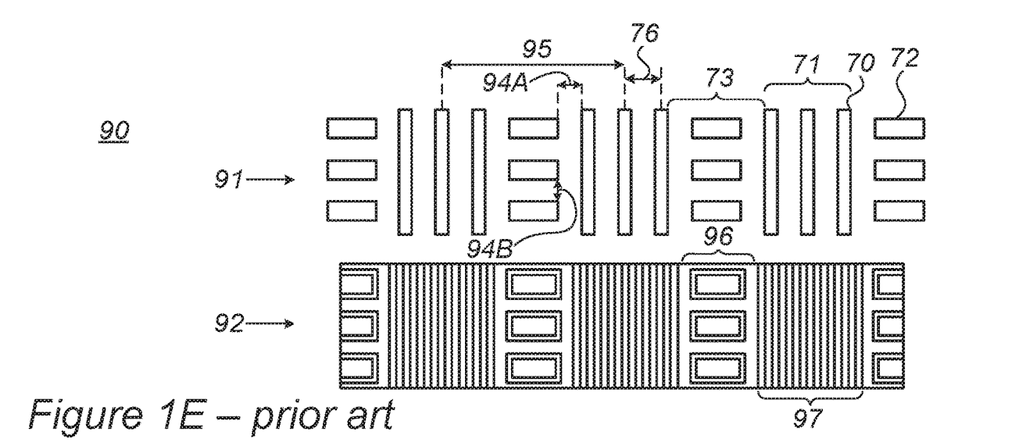
FIGS. 1E and 1F schematically illustrate segmentation schemes with CMP assist features, according to the prior art.
Figure 1F:
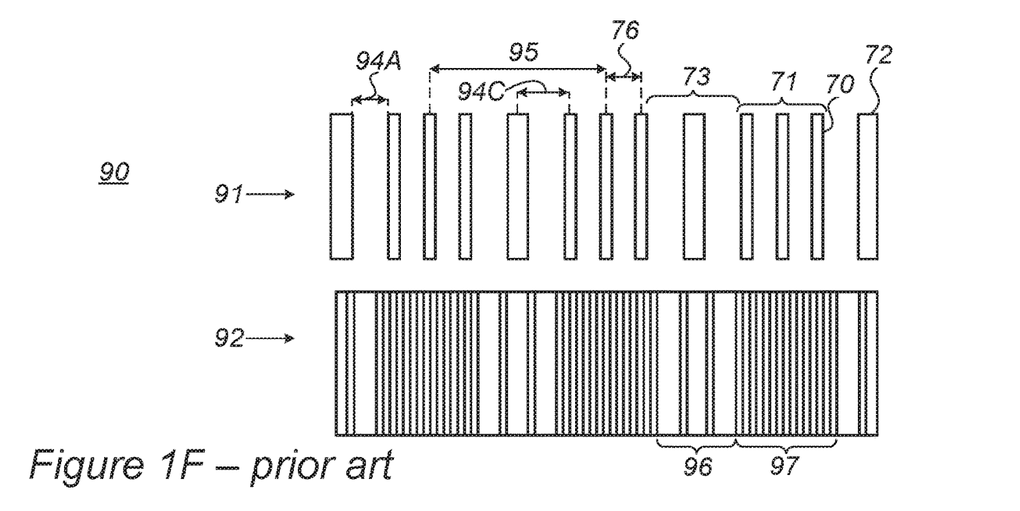

FIGS. 1E and 1F schematically illustrate segmentation schemes 90 with CMP assist features 72, according to the prior art. FIGS. 1E and 1F illustrate segmentation schemes 90 (spacer assist quadruple patterning parallel segmentation) as GDS Mask schemes 91 and as on-wafer schemes 92. CMP assist features 72 are segmented features residing in spaces 73, reducing the effective spaces (area without features). In order to maintain the distinction between bars 71 and spaces 73, the segmentation of CMP assist features 72 is by design inherently different from the segmentation of bar 71. The differences may include different segmentation orientation, illustrated schematically in FIG. 1E, and intentional incompatibility with design rules (in the order of twice of the minimum design rule) illustrated schematically in FIG. 1F (pitch 94C>>pitch 76). In addition, due to limitation of the lithographic process (to avoid proximity effects issues damaging printability), spaces 94B between CMP assist features 72 as well as spaces 94A, which are different from the minimal segmentation spacing, are maintained between segmentation elements 70 and CMP assist elements 72 (usually space 94A>>pitch 76).

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a target design method comprising defining target elements by replacing elements from a periodic pattern having a pitch p, by assist elements having at least one geometric difference from the replaced elements, to form a composite periodic structure that maintains the pitch p as a single pitch.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Prior to the detailed description being set forth, it may be helpful to set forth definitions of certain terms that will be used hereinafter.

The terms "element", "target element" and "assist element" as used in this application refer to parts of metrology targets, particularly imaging targets, at any of their production stages, such as the design stage, the reticle, the resist, various production steps and the resulting target. Typically, metrology targets comprise periodic structures having repeating elements, to which the present invention refers. For example, the target elements may be on the reticle used to transfer the target design to the wafer. It is explicitly noted that while physical characteristics of the targets at various production stages differ, the disclosed design principles and resulting structures are not limited to any specific production step, and may be applied with respect to any of the production steps, which are linked by the used lithography technology. It is emphasized that similar design principles and target element designs may be used in scatterometry targets, and the disclosed invention is applicable, with appropriate modifications of target design, to scatterometry targets as well as to imaging targets.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanism for improving and optimizing metrology target designs and thereby provide improvements to the technological field of metrology, particularly in providing overlay imaging and/or scatterometry metrology targets which optimize the tradeoff between measurement accuracy and target printability.

The inventors have found out that the fidelity of overlay metrology target may be improved by constructing targets more strictly within the bounds of compatibility with advanced patterning techniques such as self-aligned double and quadruple patterning (SADP and SAQP, respectively), which are however not to be understood as limiting the invention. Process compatibility may be improved by fill factor modulation on the basis of this compatibility. With respect to the prior art (e.g., as illustrated in FIGS. 1B-1F above), disclosed embodiments provide metrology target designs which remain within the bounds of these complex integration schemes but still produce sufficient metrology sensitivity to enable extraction of the overlay within reasonable bounds of uncertainty.

Figure 2A:
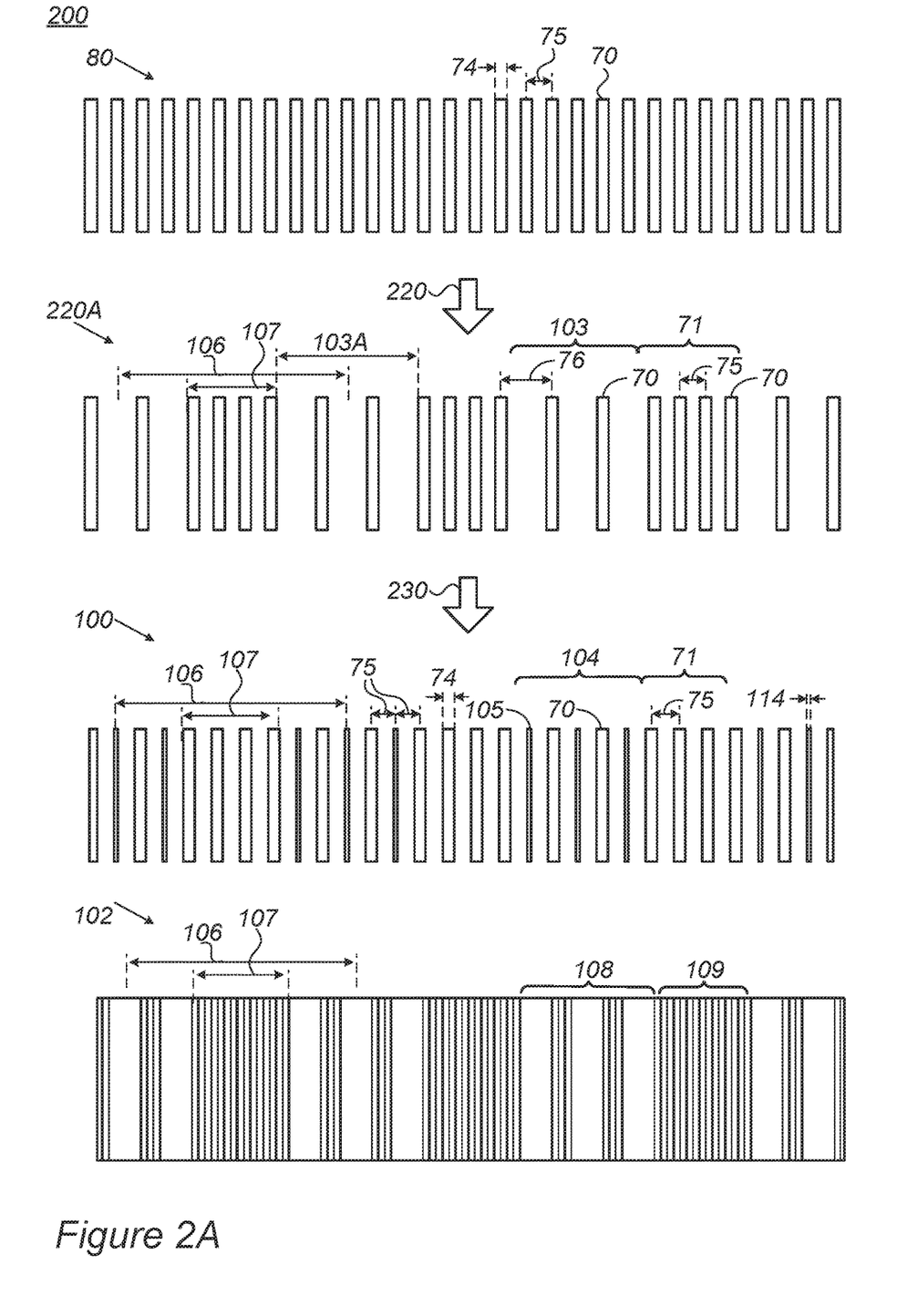
FIGS. 2A and 2B are high level schematic illustrations of composite periodic target structure designs which are derived by target design methods, according to some embodiments of the invention.
Figure 2B:
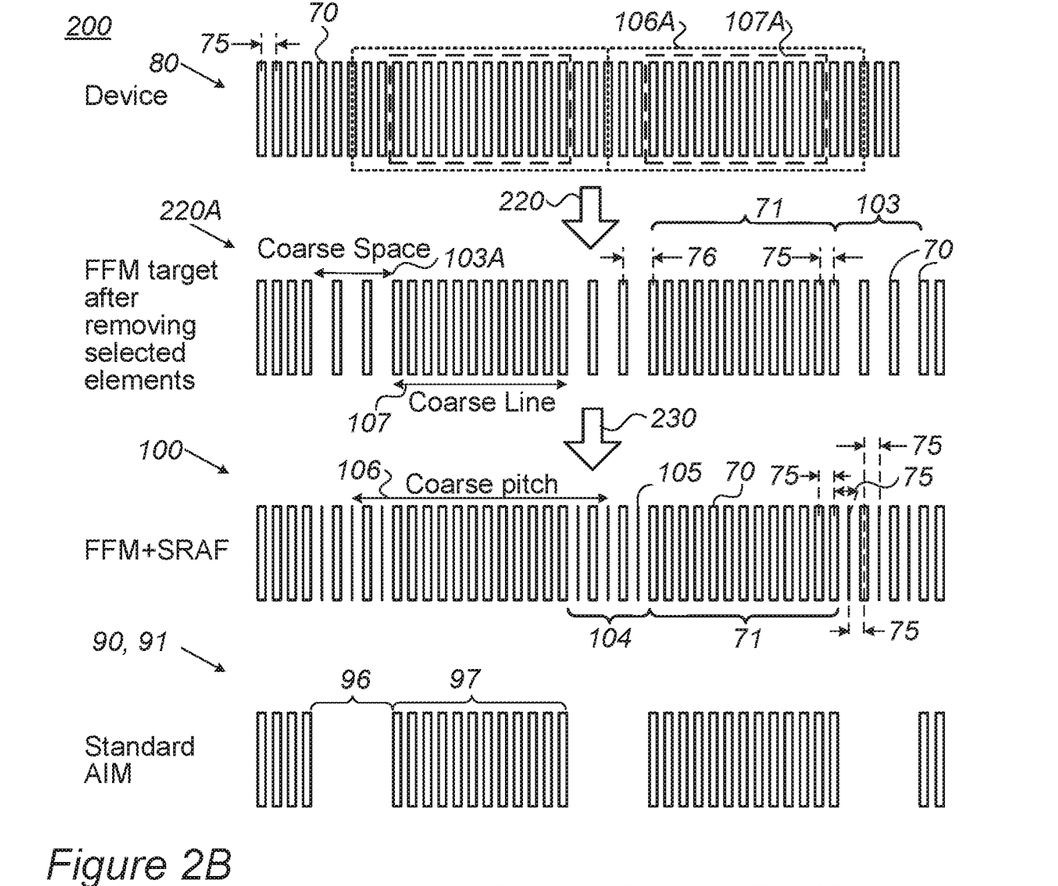

FIGS. 2A and 2B are high level schematic illustrations of composite periodic target structure designs 100 which are derived by target design methods 200, according to some embodiments of the invention. FIGS. 2A and 2B schematically illustrate spacer assist quadruple patterning fill factor modulation (FFM) segmentation schemes as a bright field mask, with elements 70 representing printed elements.

Method 200 starts from a periodic structure 80 (representing a generic device design) composed of repeating elements 70 at a pitch 75 (pitch p, e.g., in the scale of 100 nm), which defines a basic grid (elements 70 having a critical dimension (CD) 74). This starting point is different from the prior art as illustrated in FIGS. 1B-1F, which start from segmented periodic structures 90 and seeks to fill gaps 94 between segments 71. In the present invention in contrast, target elements 71 are defined, and target designs 100 are reached, by replacing elements 70 from periodic pattern 80 by assist elements 105 having at least one geometric difference from the replaced elements, to form a composite periodic structure 100 that maintains pitch 75 (the same pitch p) as a single pitch of structure 105.

The replacement may be seen as comprising a stage 220 of removing at least some of elements 70 from to-be gaps 103, generating thereby gaps 76 larger than pitch 75 in intermediate structure 220A, and a stage 230 of filling gaps 76 with assist elements 105 to re-establish pitch 75 as the single pitch p in structure 100. Target elements 71 thus comprise regions of elements 70 having the same geometric features and being at the pitch p, while gaps 104 comprise regions of assist elements 105 having different geometric features while maintain the same pitch p. As illustrated in FIG. 2B, resulting composite periodic structure 100 has target elements 71 as units 107A providing coarse lines 107 and a base unit 106A recurring at a coarse pitch 106 (e.g., in the scale of 2000 nm), which, being large enough, provides the optical resolution, while fine pitch 75 provides the printability. The different geometric feature between elements 70 and assist elements 105 may be the critical dimension (CD), e.g., assist elements 105 may be narrower than elements 70 and have a smaller assist element CD 114<target element CD 74.

The resulting target 102 has target elements 109 which are distinct enough from gaps 108 and therefore provide the required optical resolution (of coarse lines 107 and at coarse pitch 106), while the pitch p of target design 100 complies with the design rules to avoid inaccuracies resulting from printing issues.

Composite periodic target structure designs 100, comprising target elements 71 and assist elements 105 which differ by at least one geometric feature and are positioned at the single pitch p to form the composite periodic target structure, may be used as building blocks for full scale metrology target designs, using designs 100 to replace some or all of prior art designs 90, 91 (as exemplified in FIG. 2B by a standard AIM, advanced imaging metrology, target design).

Embodiments of the current invention overcome the shortcomings of the prior art. The illustrated embodiments are generally described with respect to Self-Aligned Double and Quadruple Patterning (SADP and SAQP, respectively) in a non-limiting manner, and may be applied to other integration schemes as well. The present invention discloses fill factor modulation as a new solution to the trade-off problem optical resolution (requiring a coarse pitch in the scale of 2000 nm) versus target printability (requiring a fine pitch in the scale of 100 nm). The present invention discloses a high density architecture design following the device segmentation lattice (or a predefined periodicity compatible with the photolithography and fabrication process) at fine pitch 75, in which some of recurring elements 70 are removed, either completely or replaced with SRAF (sub-resolution assist features) elements 105. The number and location of removed elements per-target may be optimized for specific target stack.

Figure 2C:
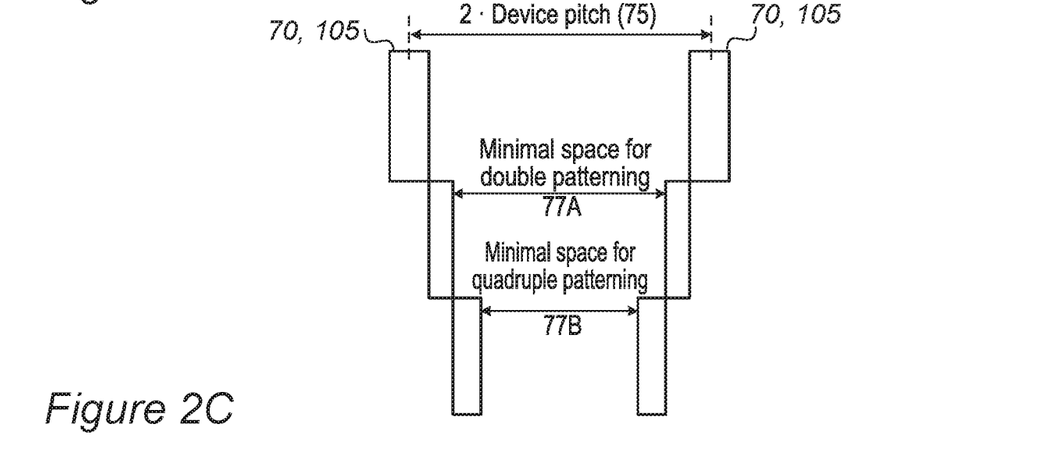
FIG. 2C is a high level schematic illustration of fine pitch selection, according to some embodiments of the invention.

FIG. 2C is a high level schematic illustration of fine pitch selection, according to some embodiments of the invention. Pitch 75 may be selected according to the respective patterning process, and in particular, the introduction of SRAF elements 105 to the mask allows supporting the periodicity of mask pattern 100 with device pitch 75 which reduces the offset between printed pattern 102 and the device due to scanner aberrations.

In certain embodiments, target structures 100 may comprise multiple target structures 71 which are configured to share a common center of symmetry upon alignment, wherein each target structure 71 comprises at least two pattern elements per direction. The pattern elements comprise features which are constrained to locations on a segmentation grid which is consistent with the periodicity of specific patterning process. The fill factor of the present vs. the absent features may be adjusted to create contrast at a periodicity which can be detected by a metrology sensor.

Elements from FIGS. 2A-2C may be combined in any operable combination, and the illustration of certain elements in certain figures and not in others merely serves an explanatory purpose and is non-limiting.

In accordance with suggested approach the minimal open space width for double and quadruple patterning is defined in the following non-limiting example. In case of double patterning the minimal open space width 77A for lithography pitch 75 of 90 nm is 3·45 nm−15 nm=120 nm, whereas for quadruple patterning the minimal open space width 77B is 5·22.5 nm−7 nm≈105 nm. This minimal space width may be further reduced by using non-periodic segmentation within coarse pitch 106. Open spaces 77A, 77B which are left in the printed pattern are a trade-off between target contrast and process compatibility of the target. The usage of polarization or dark field metrology or other contrast enhancement optical schemes may allow the reduction of the maximal width of the open spaces (77A, 77B) below lithography device pitch 75.

Figure 3A:
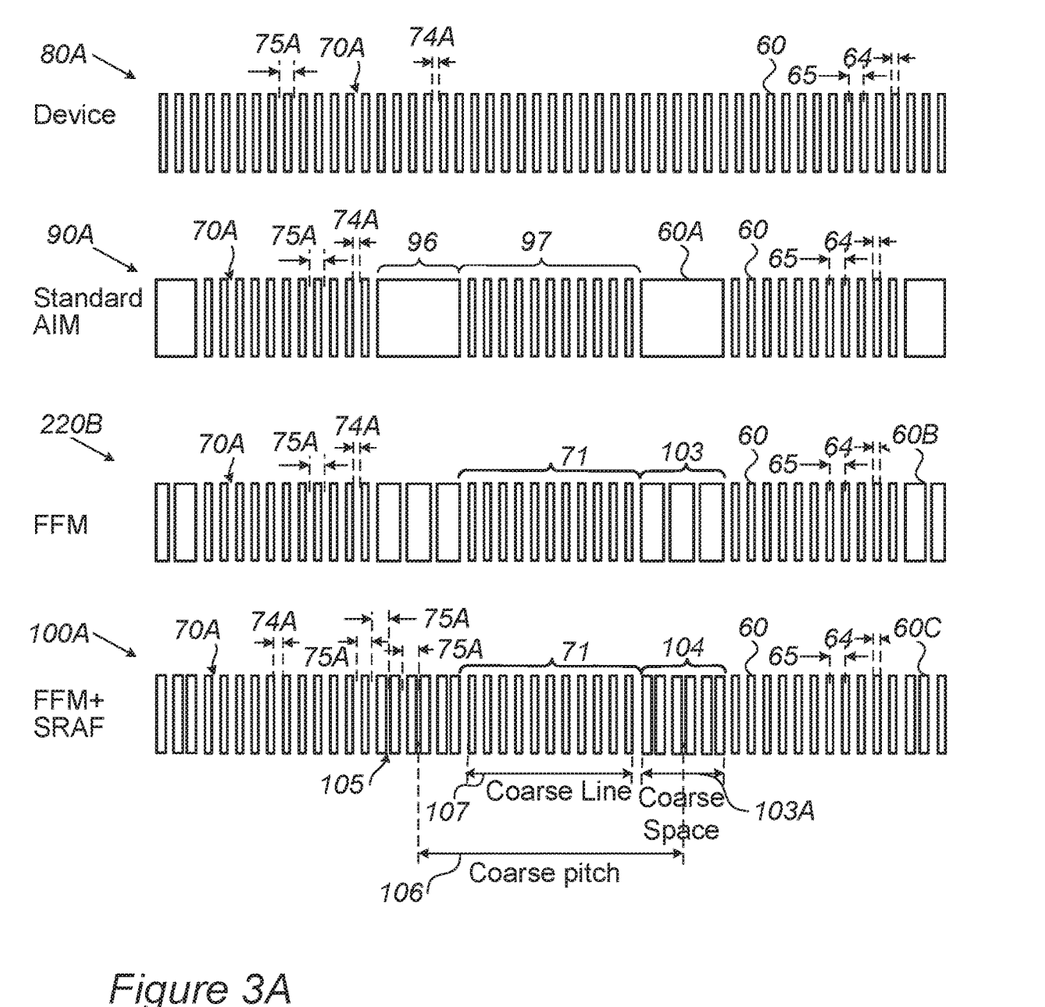
FIGS. 3A-3D are schematic illustrations of comparisons between the device, prior art targets and disclosed target designs, according to some embodiments of the invention.

FIGS. 3A-3D are schematic illustrations of comparisons between the device, prior art targets and disclosed target designs, according to some embodiments of the invention. The comparison illustrates, in a non-limiting manner, advantages of disclosed target designs 100 and ways to optimize target designs 100 with respect to the tradeoffs described above. FIG. 3A schematically illustrates masks for respective device 80A (corresponding to device 80), standard AIM target 90A (corresponding to standard AIM target 90), FFM target element 220B (corresponding to FFM target 220A) and FFM with SRAF target designs 100A (corresponding to FFM with SRAF target designs 100). The masks represent schematically dark field mask which are commonly used for overlay targets, with elements 60, 60A, 60B, 60C representing the light blocking (e.g., chrome) regions in the reticle of the mask.

FIG. 3A is a high level schematic illustration of exemplary device mask 80A, standard AIM target mask 90A, fill factor modulated (FFM) target mask 220B and FFM with SRAF target design mask 100A used in a target design test, according to some embodiments of the invention. Elements 70A, pitch 75A and CD 74A are illustrated schematically in the corresponding locations to elements 70, pitch 75 and CD 74 illustrated in FIGS. 2A and 2B. Corresponding elements 60, pitch 65 and CD 64 of respective masks 80A, 90A, 220B and 100A are schematically illustrated as well, as are target elements 71 and gaps 103, 104.

As exemplary non-limiting dimensions, device pitch 75 may be 100 nm and device CD may be 50 nm. In target design 100, coarse pitch 106 may be 1700 nm, coarse line 107 (e.g., twelve target elements 70) may be 1150 nm and coarse space 103A may be 650 nm, resulting in a Coarse line (107): Coarse space (103A) (L:S) ratio=1.77 which improves both printability and the pattern positioning error (PPE). In certain embodiments, L:S ratios larger than one (L:S>1), for either bright or dark field mask designs may be used to improve printability and PP).

Figure 3B:
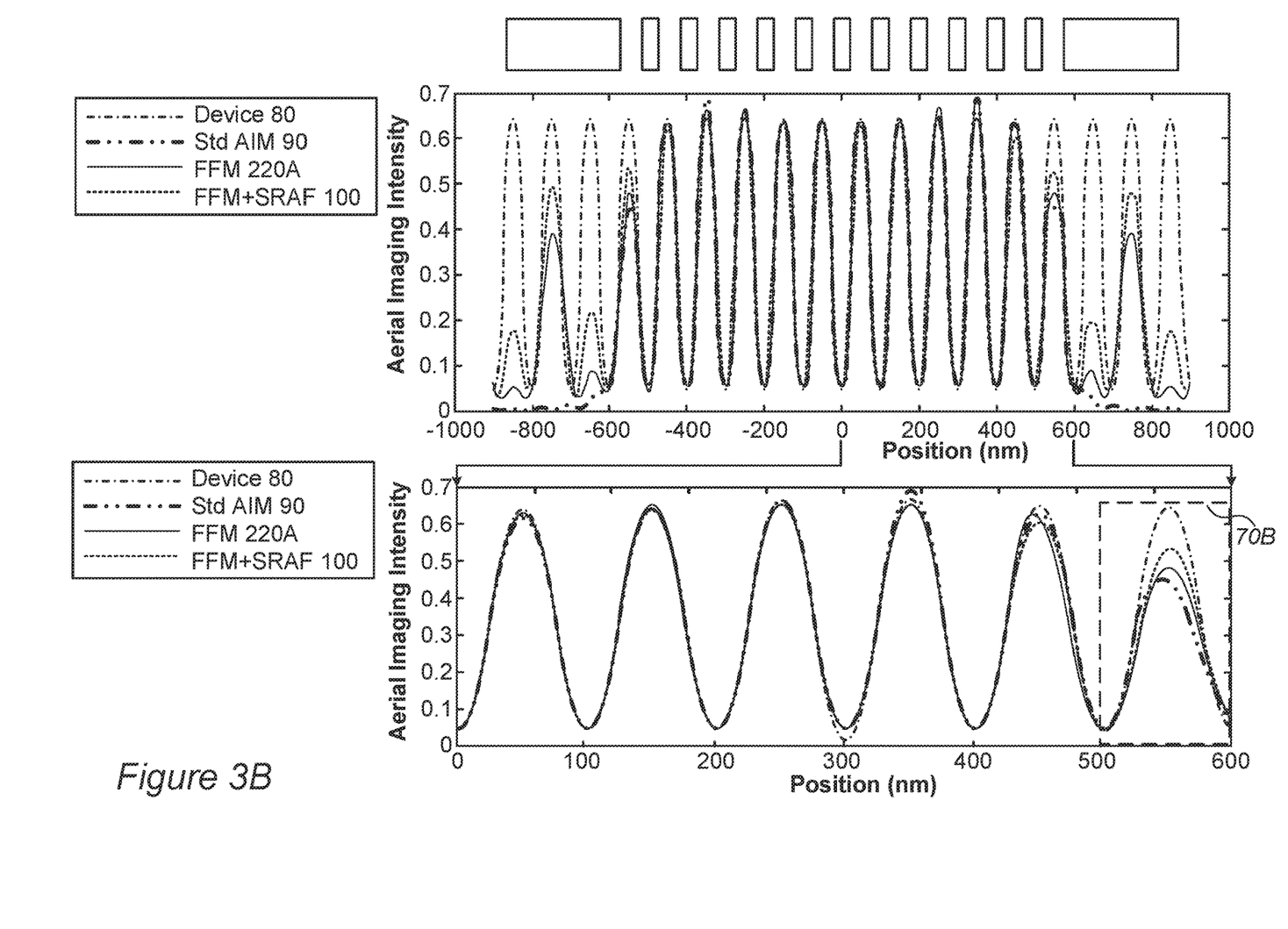

FIG. 3B is a high level schematic illustration of an aerial image performance test of the target mask designs presented in FIG. 3A, according to some embodiments of the invention. Using an optimized dipole X illumination with a dark field binary mask and positive tone development anchored on the device and using Y polarization, a comparison of the aerial images for designs 80, 90, 220A and 100 is shown. The inventors point out that with respect to AIM target 90 and FFM target 220A, FFM+SRAF target 100 provides an aerial image which matches best to device 80 and also has the largest process window. The difference in imaging performance is particularly notable at the edge line 70B, which is of special importance for the imaging performance.

Figure 3C:
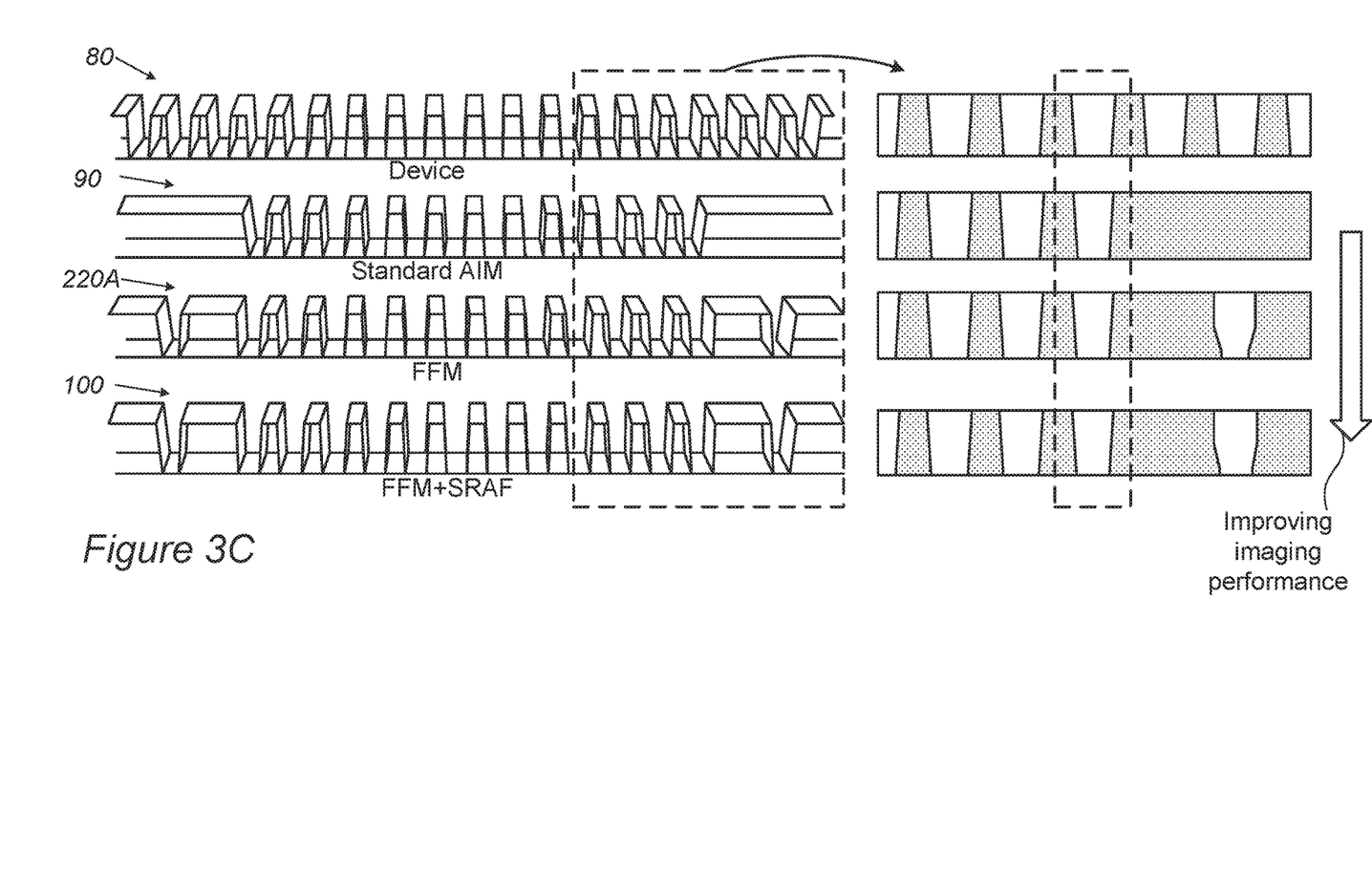

FIG. 3C is a high level schematic illustration of a resist imaging performance test of the target designs presented in FIG. 3A, according to some embodiments of the invention. The inventors point out that with respect to AIM target 90 and FFM target 220A, FFM+SRAF target 100 provides the best edge line printability, in agreement with the results presented in FIG. 3B. FIG. 3C exemplifies the improvement of imaging performance when advancing from AIM target 90 through FFM target 220A to FFM+SRAF target 100, as the resulting target image profiles become closer to the device image profile 80 (as device 80 has, by design, better lithographic performance compared to overlay targets).

Figure 3D:
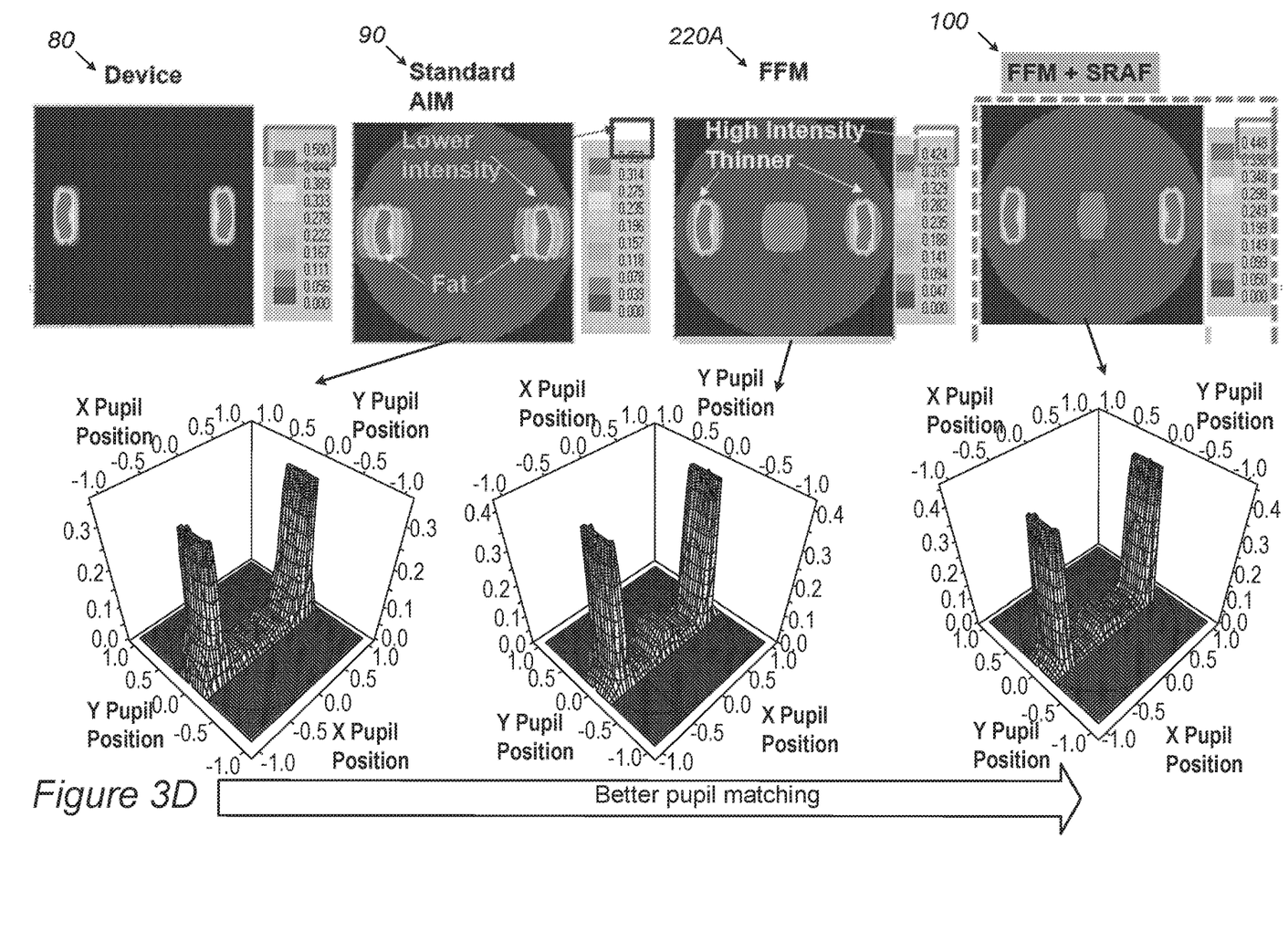

FIG. 3D is a high level schematic illustration of diffraction comparisons the scanner's exit pupil of the target designs presented in FIG. 3A, according to some embodiments of the invention. The inventors point out that with respect to AIM target 90 and FFM target 220A, FFM+SRAF target 100 provides better pupil matching results (illustrated by a broad arrow) that reduces the PPE bias as it provides the maximal intensity (top line of images) and a most similar shape of the diffraction signals (bottom line of images).

In certain embodiments, spaces 104 and/or pitch 75 may be adjusted to avoid a forbidden lithographic pitch. In metrology overlay imaging targets composed of multiple composite periodic structures 100, spaces 104 and/or pitch 75 may be adjusted to obtain a close match in diffraction patterns of the target with respect to a model device (e.g., device 80 and the diffraction patterns schematically illustrated in FIG. 3D). In certain embodiments, SRAF assist elements 105, configured to obtain a close match in diffraction patterns of the target with respect to a model device (e.g., device 80 and the diffraction patterns schematically illustrated in FIG. 3D) may be added composite periodic structure 100. Lithography simulation may be used to design edge placements of target elements 71, e.g., of edge elements 70B illustrated in FIGS. 3B and 3C.

Figure 4:
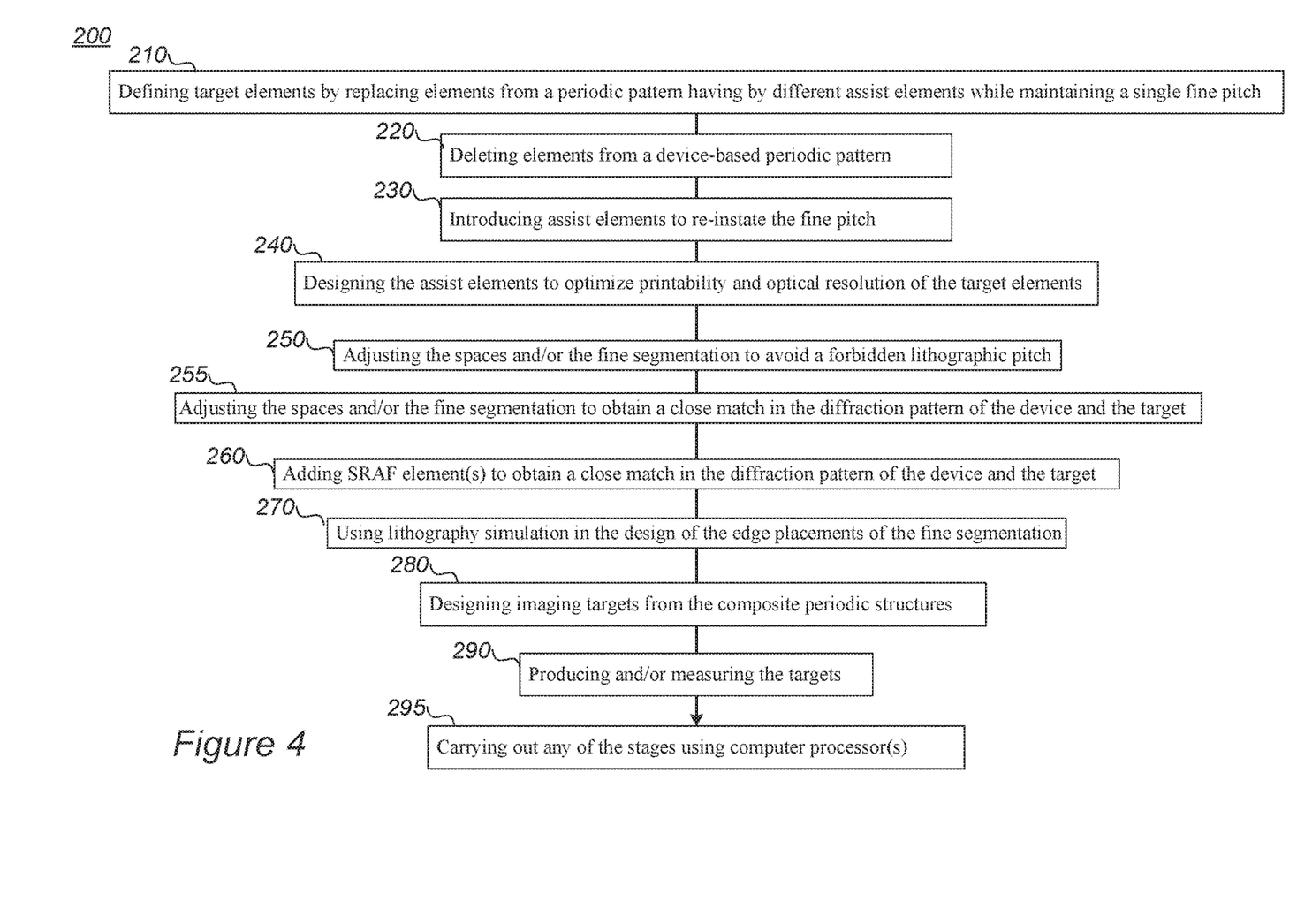
FIG. 4 is a high level flowchart illustrating a method, according to some embodiments of the invention.

FIG. 4 is a high level flowchart illustrating a method 200, according to some embodiments of the invention. The method stages may be carried out with respect to target structures 100 described above, which may optionally be configured to implement method 200. Method 200 may be at least partially implemented by at least one computer processor, e.g., in a metrology target design module. Certain embodiments comprise computer program products comprising a computer readable storage medium having computer readable program embodied therewith and configured to carry out the relevant stages of method 200. Certain embodiments comprise target design files of respective targets designed by embodiments of method 200.

Method 200 may comprise defining target elements by replacing elements from a periodic pattern having a pitch p, by assist elements having at least one geometric difference from the replaced elements, to form a composite periodic structure that maintains the pitch p as a single pitch (stage 210). The at least one geometric difference may be a critical dimension.

Method 200 may comprise deleting elements from a device-based periodic pattern (stage 220), introducing assist elements to re-instate the fine pitch (stage 230) and optionally designing the assist elements to optimize printability and optical resolution of the target elements (stage 240).

Method 200 may comprise adjusting the spaces and/or the fine segmentation to avoid a forbidden lithographic pitch (stage 250) and/or adjusting the spaces and/or the fine segmentation to obtain a close match in the diffraction pattern of the device and the target (stage 255).

Method 200 may comprise adding SRAF element(s) to obtain a close match in the diffraction pattern of the device and the target (stage 260). Method 200 may comprise using lithography simulation in the design of the edge placements of the fine segmentation (stage 270).

Method 200 may further comprise designing imaging targets from the composite periodic structures (stage 280) and producing and/or measuring the targets (stage 290). Method 200 may comprise carrying out any of the stages using computer processor(s) (stage 295). Method 200 may comprise stages taught by U.S. Pat. No. 7,925,486, incorporated herein by reference in its entirety, which discloses computer-implemented methods, carrier media, and systems for creating a metrology target structure design for a reticle layout. It is noted that overlay scatterometry targets may be designed using the disclosed principles and the disclosed target elements, and are considered likewise part of the present disclosure.

Certain embodiments comprise metrology measurements of targets 100 and/or targets designed by methods 200, possibly measurements taken using polarized illumination.

Advantageously, targets 100 and methods 200 may provide improved printability, due to constraining the location of all elements in the target to the segmentation grid. This advantage is achieved in embodiments which provide enough space to add SRAF elements 105 after increasing the CD for FFM patterns 220A. It is emphasized that this condition of commensurability between coarse and fine pitch is non-limiting. Targets 100 and methods 200 may provide improved process compatibility, due to constraining all elements to the device critical dimension, while maintaining minimal spacing between the on wafer features. Targets 100 and methods 200 may provide improved target-to-device matching (minimizing target to device offsets) due to device-like response of proposed target structure to various pattern-dependent (such as density, L/S dimensions) process steps (Lithography, Etch, CMP, possibly even deposition).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A composite periodic target structure comprising:
   a wafer;
   a plurality of target elements on the wafer; and
   a plurality of assist elements on the wafer between the target elements, wherein the assist elements differ from the target elements by at least one geometric feature, wherein the target elements and the assist elements are positioned at a single pitch p such that a fill factor of the wafer is modulated to optimize a contrast between target or assist elements and the wafer detectable by a metrology sensor, and wherein the at least one geometric feature is a critical dimension;
   wherein the fill factor is a ratio, for an area on the wafer, of an area occupied by target elements or assist elements to the area on the wafer.

2. The composite periodic target structure of claim 1, wherein spaces between the target elements and/or the pitch p avoid a forbidden lithographic pitch.

3. The composite periodic target structure of claim 1, wherein edge placements of the target elements are designed using lithography simulation.

4. The composite periodic target structure of claim 1, wherein spaces between the target elements and/or the pitch p obtain a close match in diffraction patterns of the composite periodic target structure with respect to a model device.

5. The composite periodic target structure of claim 1, wherein at least one of the assist elements is configured to obtain a close match in diffraction patterns of the composite periodic target structure with respect to a model device.

* * * * *